United States Patent [19]

Böhme

[11] Patent Number: 5,719,578
[45] Date of Patent: Feb. 17, 1998

[54] FOLDING AMPLIFIER FOR THE CONSTRUCTION OF AN A/D CONVERTER

[75] Inventor: Rolf Böhme, Bad Friedrichshall, Germany

[73] Assignee: TEMIC TELEFUNKEN microelectronic GmbH, Heilbronn, Germany

[21] Appl. No.: 580,659

[22] Filed: Dec. 29, 1995

[30] Foreign Application Priority Data

Feb. 22, 1995 [DE] Germany .................. 195 06 020.2

[51] Int. Cl.⁶ ............................................. H03M 1/38
[52] U.S. Cl. ............................................. 341/161; 341/155
[58] Field of Search ............................. 341/155, 158, 341/159, 160, 161, 163, 200

[56] References Cited

U.S. PATENT DOCUMENTS

| | | | |
|---|---|---|---|
| 3,587,089 | 6/1971 | Elliott | 340/347 |
| 4,325,054 | 4/1982 | Van De Plaasche | 340/347 AD |
| 4,599,602 | 7/1986 | Matzuzawa et al. | 340/347 AD |
| 4,931,797 | 6/1990 | Kagawa et al. | 341/162 |
| 5,157,397 | 10/1992 | Vernon | 341/157 |
| 5,307,067 | 4/1994 | Kimura et al. | 341/159 |
| 5,376,937 | 12/1994 | Colleran et al. | 341/159 |
| 5,392,045 | 2/1995 | Yee | 341/156 |
| 5,455,584 | 10/1995 | Taddiken | 341/200 |
| 5,471,210 | 11/1995 | Wingender et al. | 341/156 |
| 5,568,149 | 10/1996 | Franson | 341/156 |

FOREIGN PATENT DOCUMENTS 2645606  4/1978  Germany .
34134456A1  10/1985  Germany .

OTHER PUBLICATIONS

Van De Plassche, Rudy J. et al.; "A High-Speed 7 Bit A/D Converter"; IEEE Journal of Solid-State Circuits, vol. SC-14, No. 6, Dec. 1979; pp. 938-943.

Pretzl, Günter, "Schnelle Analog-Digital-Umsetzer"; Elektronik, 1976; pp. 16-42.

Primary Examiner—Jeffrey A. Gaffin
Assistant Examiner—Jason L. W. Kost
Attorney, Agent, or Firm—Spencer & Frank

[57] ABSTRACT

A folding amplifier is proposed for the construction of an A/D converter to which a current signal is fed as the input signal and from which a current difference signal is derived using a reference current. This current difference signal is fed to a first current-controlled current source, which is designed as a current mirror, and also to a second current-controlled current source, whereby the first current source takes over this current when the current difference signal has a positive sign and if the current difference signal has a negative sign the second current source takes over this current. The outputs of the first and second current-controlled current sources are fed to the output of the folding amplifier. Preferably, this folding amplifier is provided with a third current-controlled current source with sign reversal whose input is connected to the outputs of the first and second current sources and whose output is a V-shaped output current signal.

25 Claims, 4 Drawing Sheets

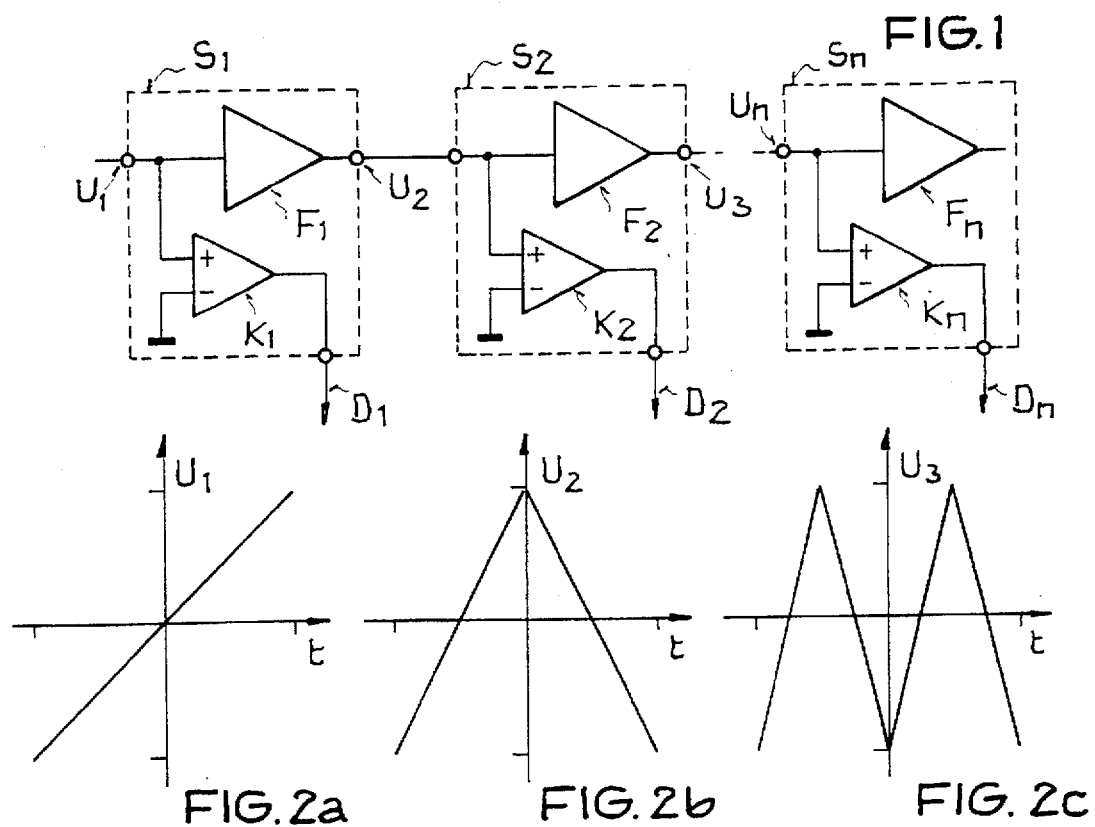
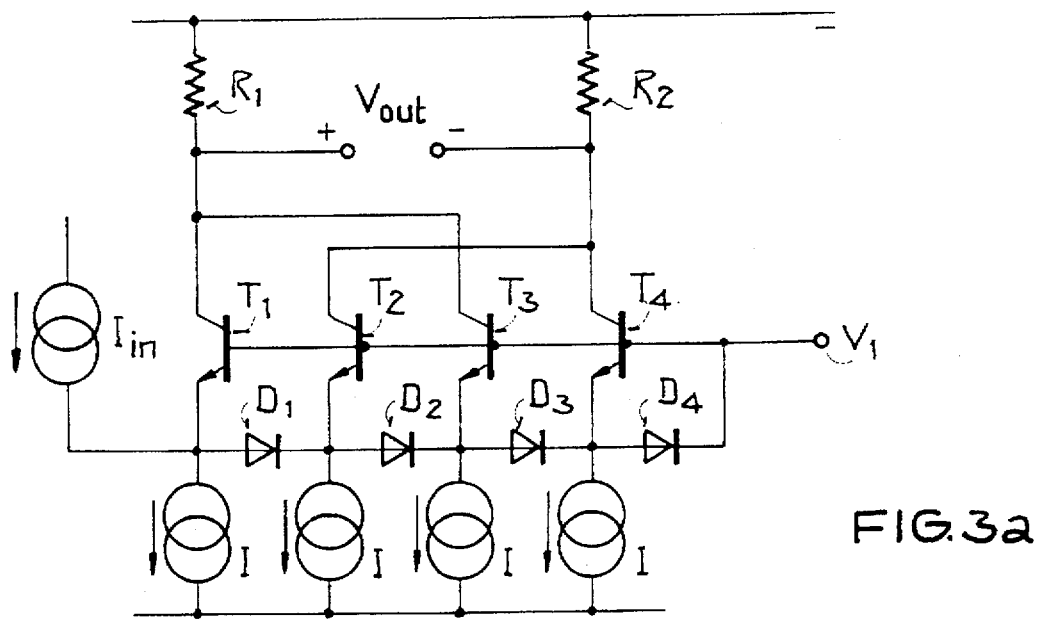

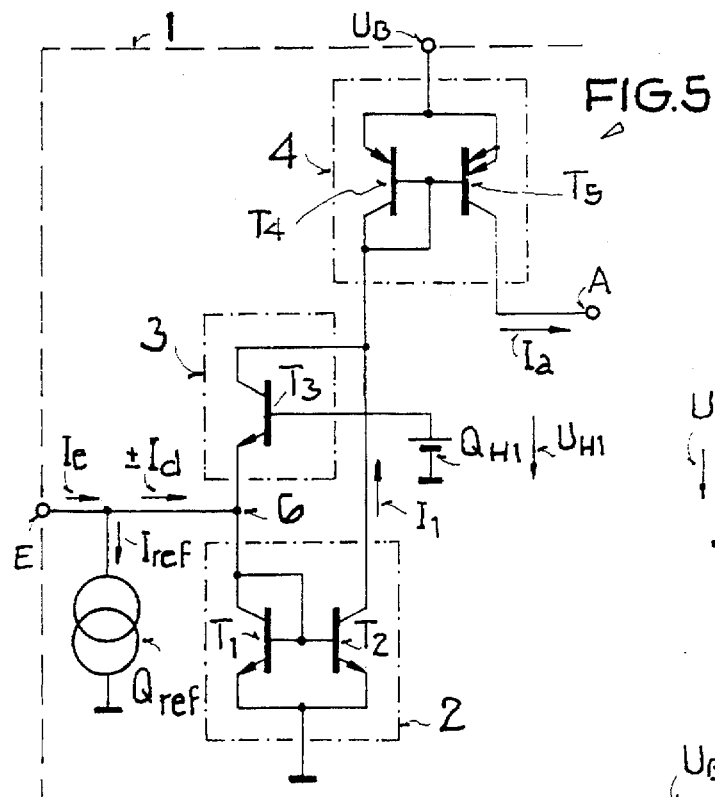
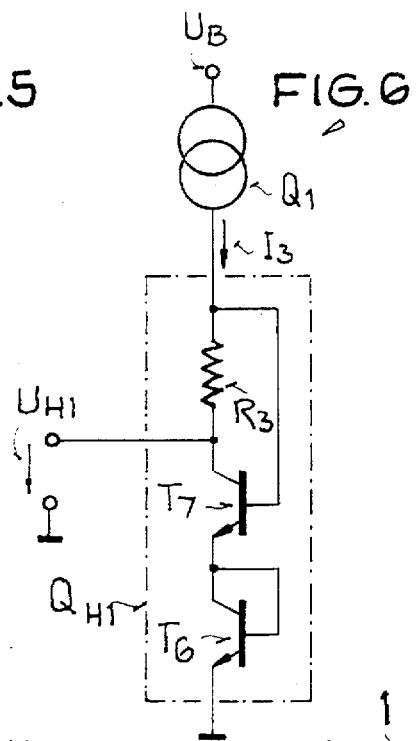
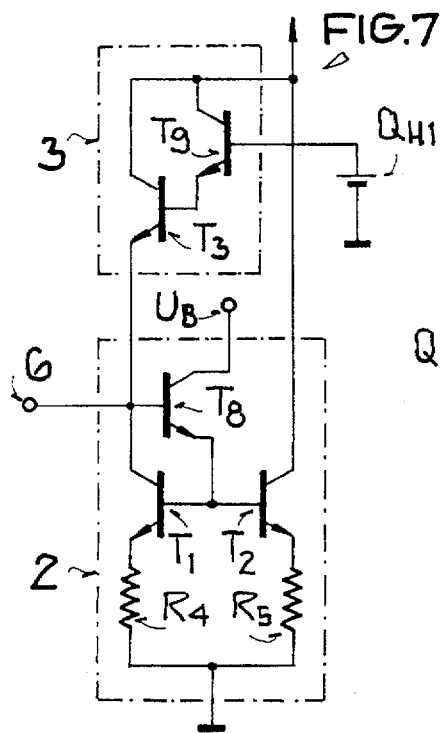
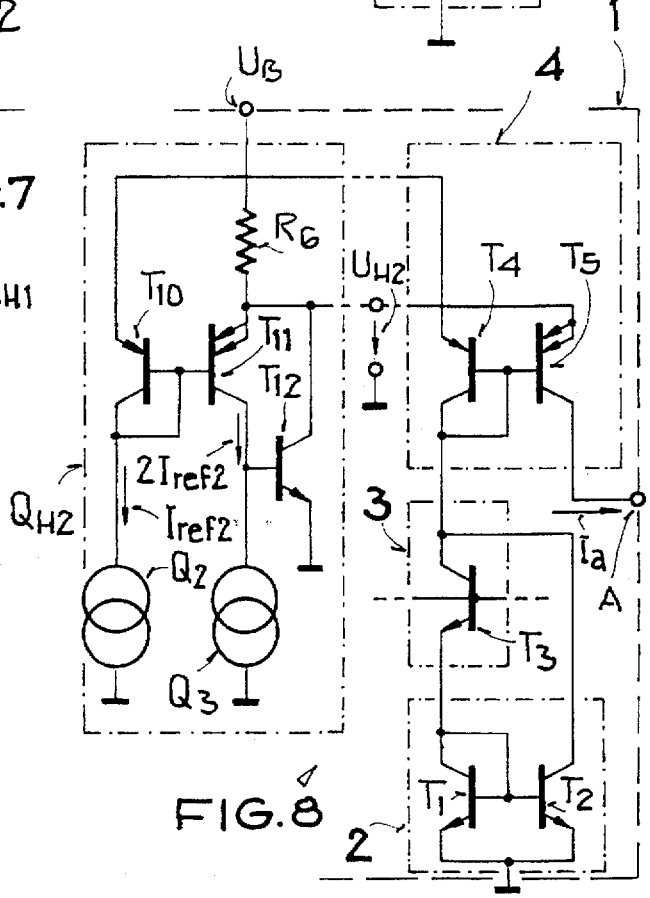

FOLDING AMPLIFIER FOR THE CONSTRUCTION OF AN A/D CONVERTER

BACKGROUND OF THE INVENTION

The invention concerns a folding amplifier to which a current signal is fed as the input signal and which generates a V-shaped current signal as the output signal, whereby a reference current source is provided for the formation of a current difference signal from the current signal and a reference current which is generated by this reference current source. Furthermore the invention concerns an A/D converter which uses such a folding amplifier in its construction.

The use of folding amplifiers for the construction of A/D converters is known for example from "Elektronik", volume 1976, issue 12, pages 36–42, where an A/D converter is described in a cascade structure according to FIG. 1, whose stages $S_i$ (i=1, ..., n) are constructed from a folding amplifier $F_i$ (i=1, ..., n) and a comparator $K_i$ (i=1, ..., n). On an analog signal $U_1$ to be digitized, the sign prefixed to this signal is set on one hand by the comparator $K_1$ and, on the other hand, an output signal $U_2$ is formed by the folding amplifier $F_1$ and fed to the second stage $S_2$ in order to submit it to the same process. At each of the outputs of the comparators $K_i$, a digital value appears according to the sign prefixed to the voltage so that these digital values $D_i$ (i=1, ..., n) form a digital word ($D_1$, $D_2$, ... Dn).

The folding amplifiers $F_i$ (i=1, ..., n) each generate a V-characteristic by forming the amounts and relocation as the transfer functions show in FIG. 2b and FIG. 2c.

According to this, a linear input voltage range—as shown in FIG. 2a—is converted by the folding amplifier $F_1$ in the first stage $S_1$ into a simple fold as shown in FIG. 2b and with folding amplifier $F_2$ in the second stage $S_2$ into a double fold as shown in FIG. 2c. In the final stage $S_n$ the folding amplifier $F_n$ produces an n-fold fold.

The bit pattern issued by the comparators $K_i$ corresponds with the so-called Gray code.

In the IEEE Journal of Solid-State Circuits, Vol. sc-14, No. 6 of Dec. 1979, pages 938–943, a folding amplifier is described for the construction of a fast 7 bit A/D converter. This folding amplifier and its transfer function is described in FIGS. 3a and 3b. This folding amplifier consists of 4 npn transistors $T_1$–$T_4$, whose bases are connected to an auxiliary voltage source $V_1$. Furthermore each emitter of these transistors $T_1$–$T_4$ is connected to a reference current source, whereby these reference current sources each generate a current I of the same value. Further important elements of this circuit are the three diodes $D_1$ to $D_3$, which are each connected between the emitters of two transistors $T_1$ and $T_2$, $T_2$ and $T_3$, and $T_3$ and $T_4$. Finally the collectors of the two transistors $T_1$ and $T_3$ are fed to a common collector resistor $R_1$ and, correspondingly, the collectors of the two transistors $T_2$ and $T_4$ are also fed to a common collector resistor $R_2$. The output voltage $V_{OUT}$ is formed by the differential voltage at these two collector resistors $R_1$ and $R_2$.

The circuit is planned for an input current range of $0 \leq I_{in} \leq 4I$. I–$I_{in}$ flows through transistor $T_1$ in the range $0 \leq I_{in} \leq I$, whilst the full current I flows through transistors $T_2$ to $T_4$. Above $I_{in}$=I$T_1$ has no current. The emitter potential of $T_1$ is raised and diode $D_1$ becomes conductive. In the range $I \leq I_{in} \leq 2I$ there flows 2I–$I_{in}$ through $T_2$. $T_1$ has no current, $T_3$ and $T_4$ conduct the current I. With a further increase in the current $I_{in}$, $T_2$ also becomes deenergized and $T_3$ takes over the difference formation in the interval $2I \leq I_{in} < 3I$ via the diode $D_2$, which then becomes conductive. Above $I_{in}$=4I all transistors are blocked and diode $D_4$ prevents an unlimited increase of the input voltage. From the superimposing of the collector currents in the common collector resistors an output voltage sequence as shown in FIG. 3b is generated. Monitoring of the diode voltage by 4 comparators provides 2 bits of information.

A digital output signal is produced by the fact that, using comparators, the non-conducting or conducting status of the diodes $D_i$ can be determined. The output voltage $V_{out}$ can then be fed to another folding amplifier or an A/D parallel converter.

The folding amplifier described in FIG. 3a is used in the construction of a 2 stage A/D converter.

SUMMARY OF THE INVENTION

The object of the invention is to provide a folding amplifier of the type described above, which has a simple circuit construction, is suitable for low supply voltages, operates dynamically homogeneously and is appropriate in the most diverse ways for the construction of an A/D converter.

According to the invention, the current difference signal, which is generated from the reference current through difference formation, is fed as a control signal not only to an initial current-controlled current source, which reverses the sign of the control signal, but also to a second current-controlled current source, which however retains the sign of the control signal, whereby with a positive sign for the current difference signal the first current source will take over this current, and, with a negative sign for the current difference signal, the second current source will take over this current. The voltage increase linked with the sign change on the input current can be kept significantly smaller than with current state-of-the-art circuits such that the changeover speed is increased and the circuit can be dimensioned with supply voltages as low as 1.2 V. The outputs of the two current-controlled current sources are fed to the output of the folding amplifier. Preferably, a third current-controlled current source with reversal of the sign can also be included whose input is connected to the outputs of the first and second current sources and whose output carries the output signal of the folding amplifier.

Preferably, the first and third current-controlled current sources can be set up as current mirrors.

For producing the folding equation $$I_a = 2 \times U_e - I_{ref}$$

in an advantageous application of the invention, the current amplification factor of the third current source, formed as a current mirror, can be set at the value 2, if the amplification factors of the first and second current sources are at 1.

Additional advantageous applications of the invention are shown in further dependent patent claims.

BRIEF DESCRIPTION OF THE DRAWINGS

The invention is shown and explained in the following by means of various embodiment examples and in connection with the drawings wherein:

FIG. 1 is a circuit of known A/D folding converter in a cascade structure;

FIGS. 2a–2c show the transfer functions for the cascade converter as shown in FIG. 1;

FIG. 5 shows the circuit of a version of the folding amplifier according to FIG. 4;

FIG. 6 shows an example of a circuit to generate the auxiliary voltage $U_{H1}$ according to FIG. 5

FIG. 7 shows an improved circuit for the folding amplifier in FIG. 5;

FIG. 8 is an example of another version according to FIG. 5 with an improved current mirror 4;

DESCRIPTION OF PREFERRED EMBODIMENTS

Figure 3B:
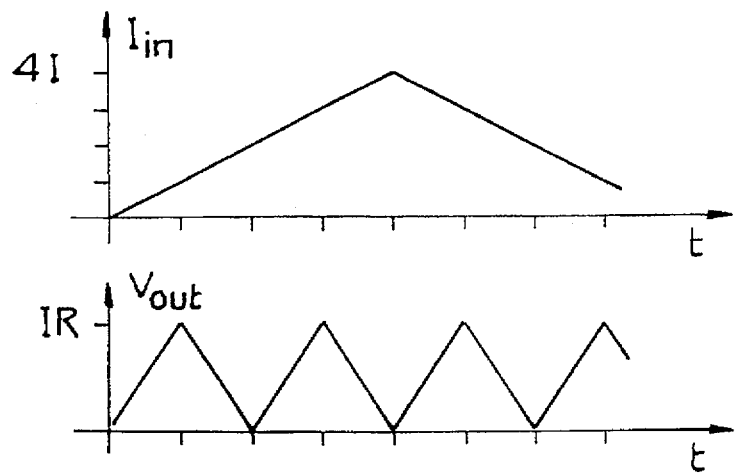
FIG. 3a is a circuit diagram of a known folding amplifier with its transfer function being shown in FIG. 3b.
Figure 4:
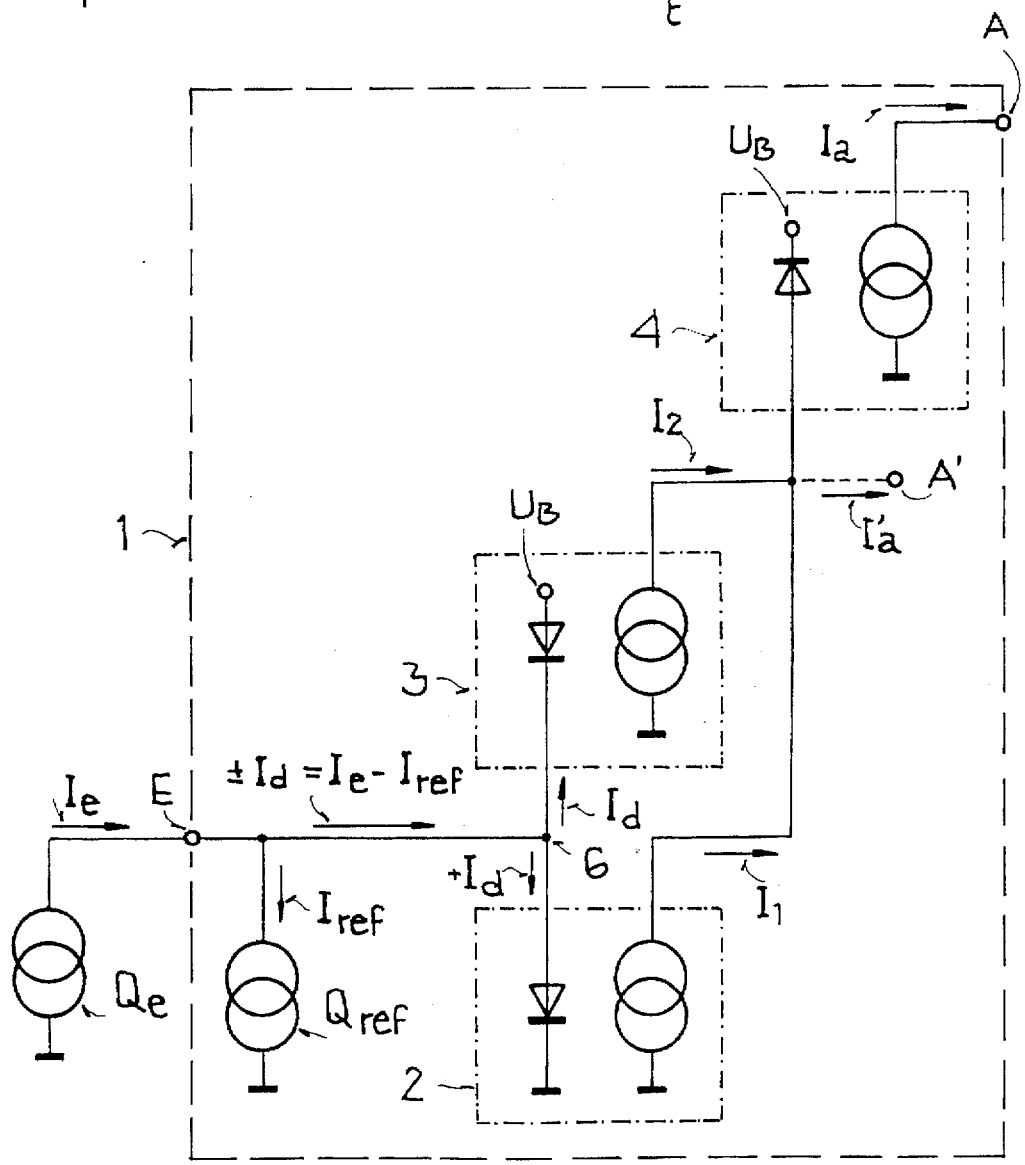
FIG. 4 shows a block circuit diagram of the folding amplifier according to the invention.

In FIG. 4, a folding amplifier with reference 1 is shown to whose input E an input signal $I_e$ generated by a current source $Q_e$ is fed. The precondition of this input signal $I_e$ is that with respect to the reference arrow, which is shown, it is not negative and can reach a maximum value $I_{emax}$. A reference current $I_{ref}$ generated by a reference current source $Q_{ref}$ is subtracted from the input current $I_e$. The value of this reference current $I_{ref}$ is $\frac{1}{2} \times I_{emax}$ so that a current difference signal $I_d$ flows to the rest of the circuit which can be of the same value positive or negative.

This current difference signal $I_d$ is fed to a circuit node 6, which is connected to two current-controlled current sources 2 and 3, for forming the value $|I_e - I_{ref}|$. Thereby the difference current $I_d$ is the control current for these two current-controlled current sources 2 and 3. Current source 2 is set up so that it reverses the sign of the control signal, whilst the second current source 3 retains the sign of the control signal which is fed to it. Thus, if the difference current $I_d$ has a positive sign, i.e., the current is fed to node 6, the "inverting" current source 2 takes over this current and generates an output current $I_1$ in the reverse direction. On the other hand, if the difference current $I_d$ has a negative sign and leads it away from node 6, the "non-inverting" current source 3 takes over this current and generates an output current $I_2$ in the same direction. Thus the input-side diode for current source 2 symbolizes that it picks up positive currents flowing towards the input, whilst the diode for current source 3 picks up the currents flowing away from the input. Because the outputs of both current sources 2 and 3 are linked, the sum of the two output currents $I_1$ and $I_2$ is always positive irrespective of the direction of the difference current $I_d$. If the two current sources 2 and 3 each have a current amplification of 2 then the circuit fulfills the folding formula $$I_a = 2 \times |I_e - I_{ref}|,$$

whereby the combined outputs of the two current sources 2 and 3 form the output A' of the folding amplifier 1 supplying the output current $I_a$. If, however, the current amplification of the two current sources 2 and 3 only have the value 1, then—as shown in FIG. 4—an amplifying function unit 4 has to be connected on the outgoing side, which as in FIG. 4 is set up as a current-controlled current source with sign reversing. Output A of this current source 4 supplies the output current $I_a$.

A simple circuit version of the block diagram of a folding amplifier 1 according to FIG. 4 is shown in FIG. 5 with bipolar transistors. In the case of this folding amplifier 1, the current-controlled "inverting" current source 2 is designed as a simple current mirror with two npn transistors $T_1$ and $T_2$, whereby on the input side of this current mirror the transistor $T_1$ is connected up as a diode and transistor $T_2$ forms the output transistor.

The "non-inverting" current source 3 is formed from an npn transistor $T_3$ as a common-base circuit in which the base is connected to an auxiliary voltage source $Q_{H1}$ which generates an auxiliary voltage $U_{H1}$ and whose emitter is connected to circuit node 6 and whose collector forms the output of current source 2. In order to finally achieve the required current amplification with the value 2 an amplifying current mirror 4 is additionally connected downstream as a further current source with pnp transistors $T_4$ and $T_5$, to which the sum of the two output currents $I_1$ and $I_2$ from the current sources 2 and 3 is fed as the input current. Thereby the output transistor $T_5$, as opposed to the input transistor $T_4$, connected up as a diode, can either have the double base emitter surface or it can consist of two parallel connected transistors.

A current $+I_d$ flowing towards the circuit node 6 is picked up by transistor $T_1$ which is connected as a diode. At circuit node 6, there then arises the flux voltage $U_{6+}$ of transistor diode $T_1$ with respect to the earth reference point. A current $-I_d$ flowing away from circuit node 6, in contrast, travels via transistor $T_3$ of current source 3. The flux voltage of the base-emitter diode $U_{BE}$ of transistor $T_3$ is subtracted from the auxiliary voltage $U_{H1}$ so that a voltage $U_{6-} = U_{H1} - U_{BE}$ with respect to earth arises at node 6.

If such a folding amplifier 1 is used for the construction of another A/D folding converter with a cascade structure to be described below, an advantageous value for the auxiliary voltage $U_{H1}$ is achieved if the two diodes have a very small current passing through them without any input current. This current may be a given fraction of the smallest current component which the converter is still to resolve, for example 20%. If the auxiliary voltage $U_{H1}$ is smaller, an unnecessarily large voltage increase of $U_{6+} - U_{6-}$ would occur in the event of a change of direction in the difference current $I_d$, which reduces the processing speed.

The folding amplifier according to FIG. 5 is ready to operate from a supply voltage of about 1 V which makes it ideal for applications in micro-power-technology. By selecting the auxiliary voltage Urn, the quiescent current when the difference current $I_d$ passes through zero, and thereby the resolution, can be freely selected, which is why it is only the inaccuracies in the amplification factors which are still of any significance. If such a folding amplifier together with a comparator is used for the construction of a stage in a folding converter, as is further described in connection with FIG. 10, then such a comparator requires no great amplification and offset voltage characteristics, because during the passage through zero this difference current $I_d$ changes very quickly from $U_{6+}$ to $U_{6-}$.

FIG. 6 shows an appropriate circuit for the generation of auxiliary voltage $U_{H1}$. A current source $Q_1$ drives a current $I_3$ through two npn transistors $T_6$ and $T_7$ connected up as diodes in series. A resistor $R_3$ inserted in the collector circuit of transistor $T_7$ produces a voltage drop which is subtracted from the sum of the two diode flux voltages. The sum of the flux voltages reduced by this voltage drop is used as auxiliary voltage $U_{H1}$. Without this resistor $R_3$, the quiescent current flowing through current sources 2 and 3 each with transistors equal to each other would correspond approximately to the current $I_3$ of current source $Q_1$. With the use of silicon transistors, the quiescent current passing through the current sources 2 and 3 is reduced to ⅒ for every 120 mV voltage drop at room temperature.

A folding amplifier according to FIG. 5 is subject to various error influences. The current transfer factors $A_1$ and $A_2$ for the current sources 2 and 3, which in the ideal case should be $A_1=-1$ and $A_2=1$, are normally smaller than 1. It is true that a minimum value can be compensated for by an amplification>2 of the following current mirror 4, but a difference in the values ($|a_1|$, $|a_2|$), however, cannot. FIG. 7 shows certain improvements for this.

In FIG. 7 instead of the simple transistor $T_3$ in the "non-inverting" current source 3, a Darlington stage consisting of two npn transistors $T_3$ and $T_9$ is used, whereby the error of this current source 3 is very much smaller. In a similar way, the addition of an emitter-follower $T_8$ to the current mirror of the "inverting" current source 2 leads to a reduction in the error caused by the finite current amplification. Furthermore, with emitter-resistors $R_4$ and $R_5$ the influence of an offset voltage between the two transistors $T_1$ and $T_2$ of this current source 2 can be reduced. A further reduction in error influences would be obtained by using a Wilson current mirror, which will be known to the specialists, but is not shown in the figure.

In a bipolar integrated circuit with lateral pnp transistors, the amplifying current mirror 3 is normally the most error-prone, because the current amplification of lateral transistors is lower, is more dependent on the working point, and also the voltage dependency of the collector current described by the "Early effect" is much greater. As shown in FIG. 8, it is thus proposed to provide the output transistor $T_5$ of the current mirror 4 with a surface larger than twice that of the input transistor $T_4$ in current mirror 4, which is connected as a diode, and at the same time to apply an auxiliary voltage $U_{H2}$ to the emitter of this transistor $T_5$ through which the current amplification is set exactly to a desired value. The auxiliary voltage $U_{H2}$ which is required for this can be generated by a reference circuit $Q_{H2}$, also shown in FIG. 8, which is installed with a current mirror, similar to current source 4, with two pnp transistors $T_{10}$ and $T_{11}$. This current mirror is fed from two reference power sources $Q_2$ and $Q_3$, which each produce a reference current $I_{ref2}$ and $2\times I_{ref2}$, by which the desired current ratio is established.

The auxiliary voltage $U_{H2}$ is produced by an amplifier constructed as an npn transistor $T_{12}$ in common-emitter configuration with a collector resistor $R_6$, the base of which amplifier is connected as the input to the connecting point of the collector of output transistor $T_{11}$ with current source $Q_3$ and from whose collector the desired auxiliary voltage $U_{H2}$ is taken as output.

Figure 9:
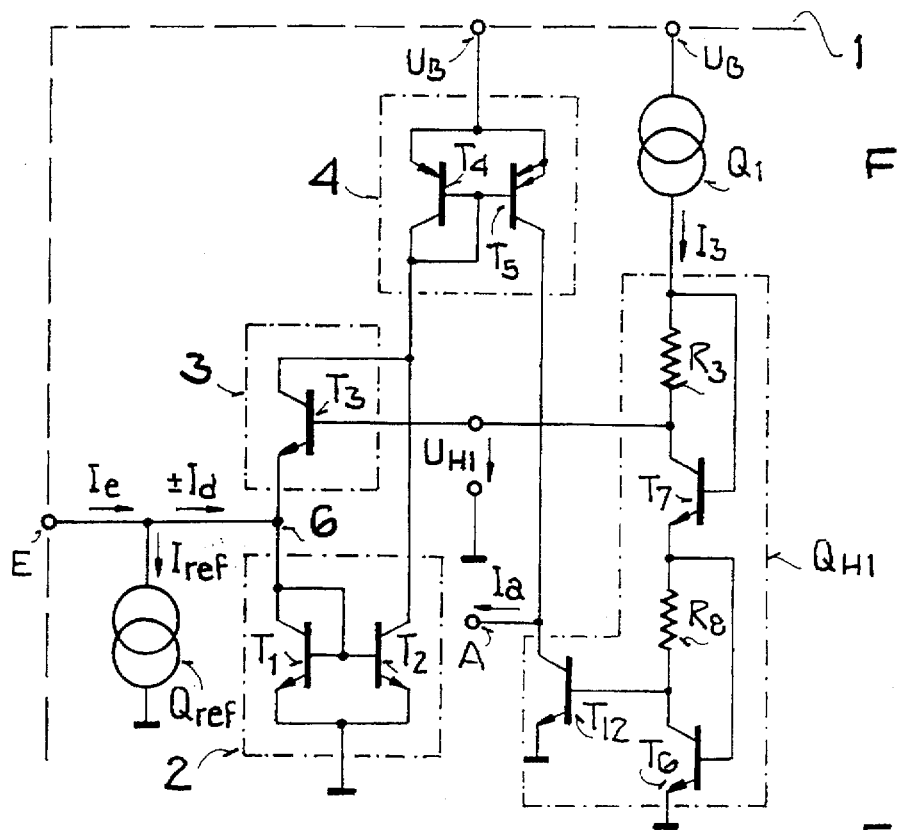
FIG. 9 shows another example of the folding amplifier according to the invention with improved behavior during zero crossing of the difference current $I_d$ as opposed to the version shown in FIG. 5

A particularly critical point in all the previously described circuits is the passage through zero of the difference current $I_d$. In the folding amplifier shown in FIG. 5, the currents in the region of the zero crossing in current sources 2, 3 and 4 are very small, which often involves a serious drop in the current amplification. In the case of bipolar transistors, leakage currents sometimes lead to disturbances in the circuit. These disturbances reduce the sharpness of the zero point in the output current $I_a$, and reduce the achievable resolution in a D/A converter. To mitigate these disturbances according to FIG. 9 by selecting a suitable auxiliary voltage $U_{H1}$, a particular quiescent current is produced, which is subtracted from the output current of the current mirror 4. Building up from the circuit in FIG. 6, a collector resistor $R_8$ is also inserted on transistor $T_6$ to produce a compensation current in order to connect the base of a further npn transistor $T_{12}$—at the connection for the collector of this transistor $T_6$—whose emitter is linked to the reference point.

The collector connection of this transistor $T_{12}$ forms the required current source if the resistor $R_8$ is about half of the value of resistor $R_7$ and transistor $T_{12}$ has 4 times the base-emitter surface with respect to the other npn transistors.

Figure 10:
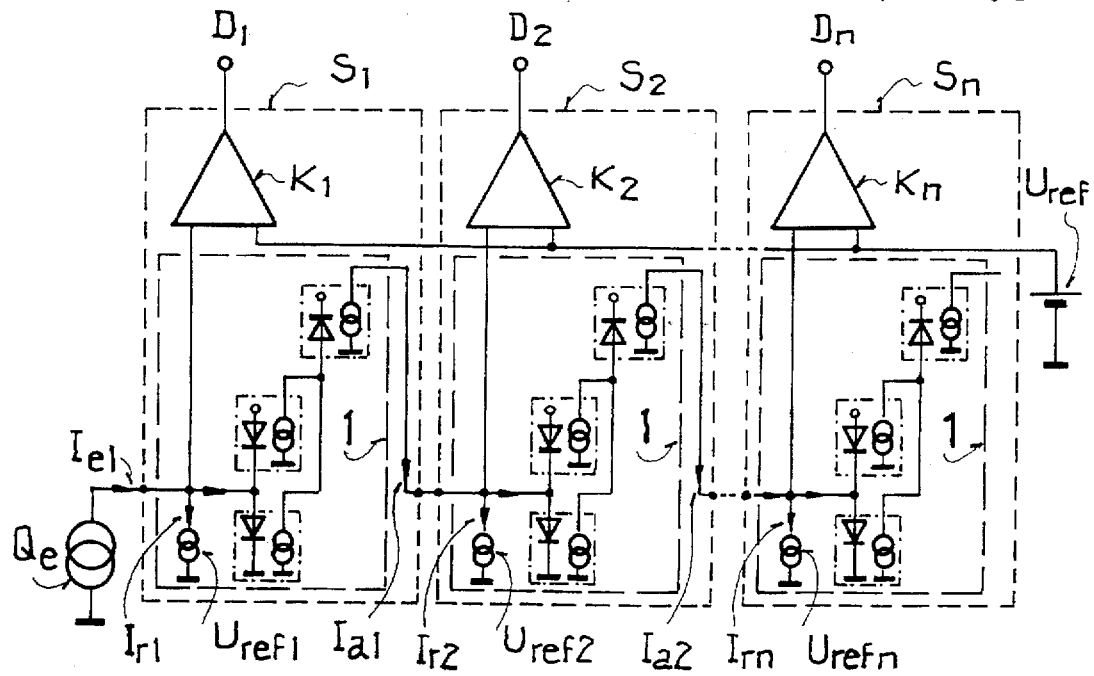
FIG. 10 is a block circuit diagram of an A/D folding converter in a cascade structure according to the invention.

The folding amplifiers 1 shown in the examples can be used with advantage in the construction of an A/D folding converter in cascade structure according to FIG. 10. A current source $Q_e$ generates the input signal $I_{e1}$ which is fed to the first stage $S_1$ of the D/A folding converter. This stage $S_1$, and in general the following stages $S_2$ to $S_n$ also, contain a folding amplifier 1 of the type described above as well as a comparator $K_i$ ($i=1, \ldots n$). In the first cell $S_1$, the current $I_{r1}$ of the reference current source $Q_{ref1}$ is subtracted from the input current $I_{e1}$, whereby the value of this reference current $I_{r1}=\frac{1}{2}\times I_{emax}$, and $I_{emax}$ represents the maximum input current. The difference current signal $I_d$ thereby produced is fed to current sources 2 and 3 as well as comparator $K_1$. The zero passage of this difference current $I_d$ is detected by comparator $K_1$, whereby a logic signal $D_1$ appears at its output, which shows whether the current difference $I_d$ is positive or negative. The output current $I_{a1}$ of folding amplifier 1 is fed as input signal $I_{e2}$ to the input of the second stage $S_2$ where this signal is subject to the same processing. Because of the folding of the input signal $I_{e1}$ in the first stage $S_1$, the trigger point is passed through twice (compare FIG. 2c). At the output of comparator $K_2$ of this second stage $S_2$, the second binary signal $D_2$ will appear. The output signal $I_{a2}$ of folding amplifier 1 in this second stage $S_2$ is again fed to the next stage until in this way the final stage $S_n$ is reached. In this last stage $S_n$ the folding amplifier 1 generates no further output signal. A reference voltage $U_{ref}$ acts as a reference voltage for comparators $K_1$ to $K_n$. It is fed respectively to one input of these comparators. The digital word $D_1, D_2, \ldots, D_n$ received at the outputs of these comparators represents the digitized analog signal $I_e$ in Gray code.

What is claimed is:

1. A folding amplifier having an input to which a current signal is fed as an input signal and which generates a V-shaped current signal as the output signal at an output of the folding amplifier, and circuit means connected to the amplifier input, for the formation of a current difference signal from the current signal and a reference current, and including a reference current source provided to generate this reference current; and wherein:

a) the current difference signal is red as a control signal both to a first current-controlled current source, which reverses the sign of the control signal, and also to a second current-controlled current source, which retains the sign of the control signal, whereby b) if the current difference has a positive sign, the first current source takes over this current, and, if the sign is negative, the second current source takes over this current, and c) the two respective outputs of the first and second current sources are connected to the output of the folding amplifier.

2. A folding amplifier according to claim 1, wherein a third current-controlled current source with sign reversal is provided, to the input of which is fed the sum of the two output currents from the first and second current sources, and the output of which is the output of the folding amplifier.

3. A folding amplifier according to claim 1, wherein the mirror factor of the third current source has the value 2.

4. A folding amplifier according to claim 3, wherein the second current source is a bipolar transistor in a common-base circuit configuration.

5. A folding amplifier according to claim 4, wherein the transistor emitter forms the input and the transistor collector forms the output, and the base is connected with a first auxiliary voltage source.

6. A folding amplifier according to claim 5, wherein the third current source is formed from an input transistor connected as a diode and more than two output transistors which are identical to the input transistor, and wherein the linked emitters of these output transistors are connected to a second auxiliary voltage source for setting the current amplification factor.

7. A folding amplifier according to claim 6, wherein the second auxiliary voltage source is formed as a current mirror, in which the auxiliary voltage is taken off the emitter of the output transistor of this current mirror; wherein the input and output of this current mirror are each connected to a reference current source; and wherein the input of a control amplifier is connected to the output of the current mirror and the output of the control amplifier is connected to the emitter of the output transistor of this current mirror.

8. A folding amplifier according to claim 7, wherein the control amplifier is formed from a transistor whose input is the base connection and whose output is the collector connection and whose collector is connected via a resistor to the supply voltage.

9. A folding amplifier according to claim 8, wherein the first auxiliary voltage source comprises the series connection of two transistor diodes which are fed from a current source, and a resistor connected in front of the collector of the transistor diode connected to the current source, and, at the connecting point of this resistor and the collector, the first auxiliary voltage is taken off.

10. A folding amplifier according to claim 9, wherein a further resistor is connected in front of the collector of the second transistor diode, and, at the connecting point of this further resistor with the collector if the second transistor diode, the base of a further transistor is connected which serves as a current source for quiescent current compensation.

11. A folding amplifier according to claim 5, wherein the third current source is formed from an input transistor connected as a diode and an output transistor with more than twice the base-emitter surface of the input transistor, and wherein the linked emitters of this output transistor are connected to a second auxiliary voltage source for setting the current amplification factor.

12. A folding amplifier according to claim 11, wherein the second auxiliary voltage source is formed as a current mirror, in which the auxiliary voltage is taken off the emitter of the output transistor of this current mirror; wherein the input and output of this current mirror are each connected to a reference current source; and wherein the input of a control amplifier is connected to the output of the current mirror and the output of the control amplifier is connected to the emitter of the output transistor of this current mirror.

13. A folding amplifier according to claim 12, wherein the control amplifier is formed from a transistor whose input is the base connection and whose output is the collector connection and whose collector is connected via a resistor to the supply voltage.

14. A folding amplifier according to claim 13, wherein the first auxiliary voltage source comprises the series connection of two transistor diodes which are fed from a current source, and a resistor connected in front of the collector of the transistor diode connected to the current source, and, at the connecting point of this resistor and the collector, the first auxiliary voltage is taken off.

15. A folding amplifier according to claim 14, wherein a further resistor is connected in front of the collector of the second transistor diode, and, at the connecting point of this resistor with the collector, the base of a further transistor is connected which serves as a current source for quiescent current compensation.

16. A folding amplifier according to claim 5, wherein the third current source is constructed from an input transistor, connected as a diode, and an output transistor identical to this input transistor.

17. A folding amplifier according to claim 16, wherein the first auxiliary voltage source comprises the series connection of two transistor diodes, which are fed from a current source, and a resistor connected in front of the collector of the transistor diode connected to the current source, and, at the connecting point of this resistor and the collector, the first auxiliary voltage is taken off.

18. A folding amplifier according to claim 17, wherein a further resistor is connected in front of the collector of the second transistor diode, and, at the connecting point of this further resistor with the collector of the second transistor diode, the base of a further transistor is connected which serves as a current source for quiescent current compensation.

19. A folding amplifier according to claim 5, wherein the third current source is formed from an input transistor connected as a diode and an output transistor with twice the base-emitter surface of the input transistor.

20. A folding amplifier according to claim 19, wherein the first auxiliary voltage source comprises the series connection of two transistor diodes, which are fed from a current source and a resistor connected in front of the collector of the transistor diode connected to the current source, and, at the connecting point of this resistor and the collector, the first auxiliary voltage is taken off.

21. A folding amplifier according to claim 20, wherein a further resistor is connected in front of the collector of the second transistor diode, and, at the connecting point of this further resistor with the collector of the second transistor diode, the base of a further transistor is connected which serves as a current source for quiescent current compensation.

22. A folding amplifier according to claim 2, wherein the first and third current sources are set up as current mirrors.

23. A folding amplifier according to claim 22, wherein the amplification factor of the second current source has the value 1.

24. A folding amplifier according to claim 23, wherein the mirror factor of the first current source has the value 1.

25. An A/D cascade converter comprising at least two stages wherein:
  a) each stage comprises a folding amplifier according to claim 1 as well as a comparator, with the output signal of the folding amplifier providing the input signal for the succeeding stage,
  b) a reference voltage is provided which is applied to an input of the comparator of each stage, and
  c) the other input of the comparator of a given stage is fed the current difference signal produced by the folding amplifier of the same stage, whereby the comparator output forms a 1-bit output.

* * * * *